United States Patent [19]

Duncan et al.

[11] 3,784,883

[45] Jan. 8, 1974

[54] TRANSISTOR PACKAGE

[75] Inventors: David M. Duncan, San Francisco; Joseph H. Johnson, Sunnyvale, both of Calif.

[73] Assignee: Communications Transistor Corporation, San Carlos, Calif.

[22] Filed: July 19, 1971

[21] Appl. No.: 163,981

[52] U.S. Cl. ...... 317/234 R, 317/234 A, 317/234 G, 174/52 S, 333/84 M

[51] Int. Cl. ............................ H01l 3/00, H01l 5/00

[58] Field of Search ......................... 317/234, 4, 4.1, 317/1, 5, 5.4; 174/525; 333/84 M

[56] References Cited

UNITED STATES PATENTS

| | | | |
|---|---|---|---|
| 3,626,259 | 12/1971 | Ruzinsky | 317/234 |
| 3,649,872 | 3/1972 | Garboushian | 317/234 |
| 3,387,190 | 6/1968 | Winkler | 317/234 |
| 3,478,161 | 11/1969 | Carley | 317/234 |
| 3,489,956 | 1/1970 | Yanai et al. | 317/234 |
| 3,509,434 | 4/1970 | Yanai et al. | 317/234 |
| 3,515,952 | 6/1970 | Robinson | 317/234 |
| 3,554,821 | 1/1971 | Caulton et al. | 317/234 |
| 3,577,181 | 5/1971 | Belohoubek | 317/234 |

*Primary Examiner*—John W. Huckert
*Assistant Examiner*—Andrew J. James
*Attorney*—Stanley Z. Cole

[57] ABSTRACT

In a transistor packaging having an input, an output and a common lead, the common lead includes a pair of terminal strip portions disposed on opposite sides of the transistor die. An array of generally parallel common connector wires interconnect both of the common lead terminal strip portions and one of the base or emitter electrode structures on the transistor die. The other one of the emitter or base electrode structures is connected to the input lead via the intermediary of an array of wires interdigitated with the array of common connector wires. In this manner, the common lead inductance of the transistor package is reduced resulting in improved gain and/or r.f. stability of the transistor.

6 Claims, 5 Drawing Figures

INVENTORS
DAVID M. DUNCAN
JOSEPH H. JOHNSON
BY Stanley Z. Cole
ATTORNEY

INVENTORS
DAVID M. DUNCAN
JOSEPH H. JOHNSON

BY [signature]
ATTORNEY

TRANSISTOR PACKAGE

DESCRIPTION OF THE PRIOR ART

Heretofore, radio frequency transistor packages have been constructed wherein input, output and common leads have been connected to the transistor die with a first array of input lead connector wires interdigitated with and generally parallel to a second array of common connector wires for reducing the common lead inductance of the transistor package. This was applied in a microstrip transistor package where the transistor die was mounted overlaying the top surface of an output microstrip line near the inner end thereof which was mutually opposed to the inner end of the input microstrip line. The array of common connector wires passed up from a common lead underlying the input and output leads through a gap between the mutually opposed ends of the input and output strip lines, for making connection to the transistor die. The input lead was connected to the transistor die via an array of input connector wires interdigitated with and being generally parallel to the array of common connector wires. Such a transistor is disclosed and claimed in co-pending U.S. application No. 121,908 filed 8 Mar. 8, 1971 and assigned to the same assignee as the present invention. While interdigitating and paralleling the arrays of input and common connector wires produces a substantial reduction in the common lead inductance resulting in increased gain and stability of the transistor, it is desired to still further reduce the common lead inductance for further improvement in the gain and/or stability of the transistor package.

SUMMARY OF THE PRESENT INVENTION

The principal object of the present invention is the provision of an improved R.F. transistor package.

In one feature of the present invention, the common lead structure within the transistor package includes a pair of terminal strip portions disposed on opposite sides of the transistor die, an array of generally parallel input connector wires interconnect the input lead and one of the emitter and base electrode structures of the die while a second array of generally parallel common connector wires interconnect both of the terminal strip portions of the common lead and the other one of said emitter and base electrode structures of the transistor die, whereby the common lead inductance is reduced for improved gain and/or stability of the transistor package.

In another feature of the present invention, the array of input connector wires are interdigitated with one set of the common connector wires and are generally parallel to the common connector wires, whereby the common lead inductance of the transistor package is substantially reduced.

In another feature of the present invention, the common lead structure underlies the input and output leads of the transistor package and the array of common connector wires is connected to one terminal strip portion of the common lead by passing through a gap between the input lead and the output lead, and the other end of the array of common connector wires is connected to the second terminal strip portion of the common lead through a slot in the output lead.

In another feature of the present invention, the common lead structure includes a first terminal strip portion interposed between the mutually opposed ends of the input and output leads, and the second terminal strip portion of the common lead comprises a conductive bridge passing over the output lead structure.

Other features and advantages of the present invention will become apparent upon a perusal of the following specification taken in connection with the accompanying drawings, wherein:

DESCRIPTION OF THE PREFERRED EMBODIMENTS

Figure 2:
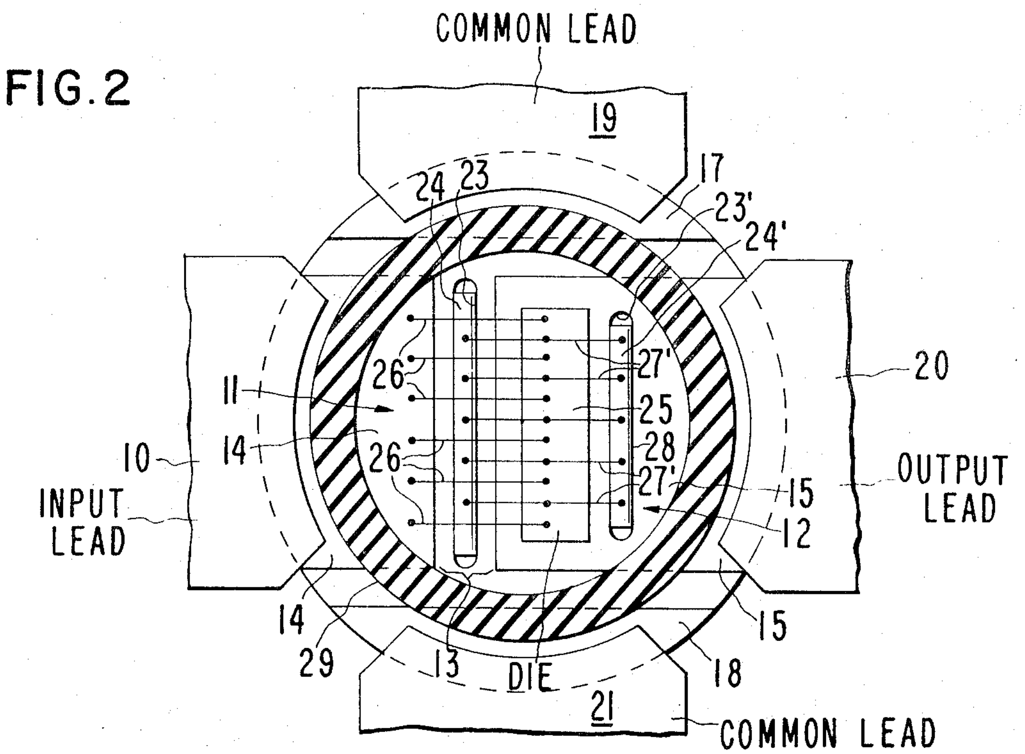
FIG. 2 is a sectional view of the structure of FIG. 1 taken along line 2—2 in the direction of the arrows.
Figure 1:
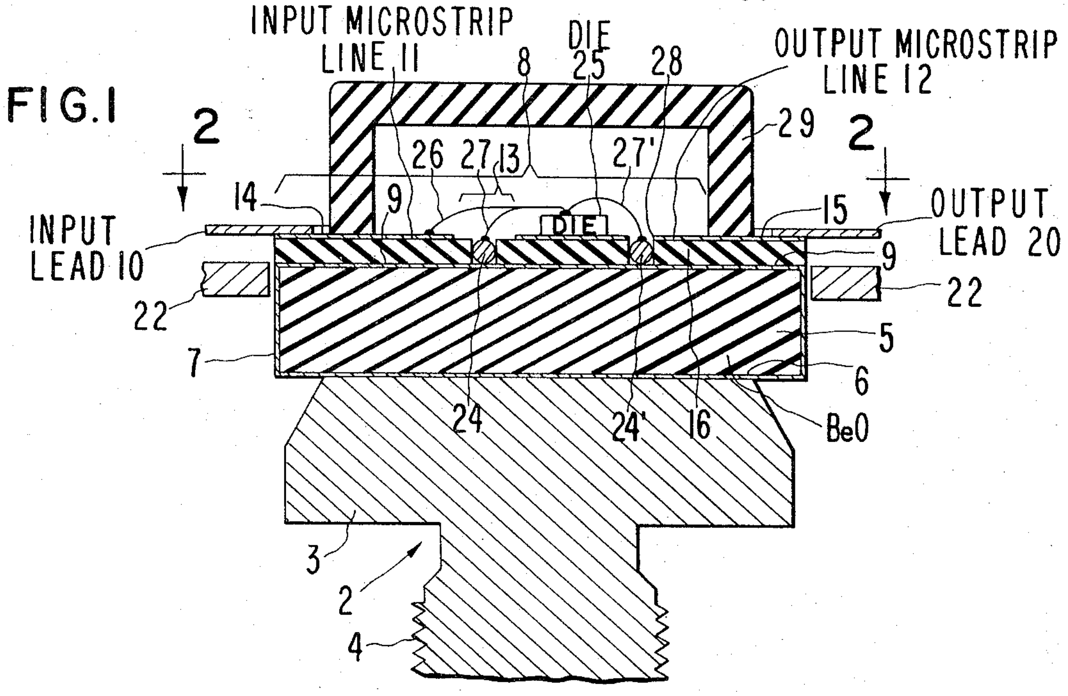
FIG. 1 is a longitudinal sectional view of a radio frequency transistor package incorporating features of the present invention.

Referring now to FIGS. 1 and 2, there is shown a radio frequency transistor package 1 incorporating features of the present invention. The transistor package 1 includes a heat sink structure 2, such as a copper stud 3, having a threaded portion 4 to be screwed into a threaded mounting hole in a suitable heat sink or circuit chassis, not shown.

A thermally conductive base plate structure 5, such as a metalized beryllia or alumina disc, is fixedly secured to the upper end of the stud 3, as by brazing at 6. In a typical example, the base plate 5 is 0.050 inch thick and 0.200 inch in diameter and is metalized over its entire outer surface at 7 with a suitable electrically conductive metalizing material such as molybdenum-manganese, plated with gold to an overall thickness, as of 0.001 inch.

A solid dielectric filled microstrip line structure 8 is fixedly secured to the top of the base plate 5 in heat exchanging relation therewith, as by brazing at 9. The microstrip line structure 8 includes an input microstrip line section 11 and an output microstrip line section 12 disposed in diametrically opposed relation, with the inner ends of the input and output microstrip lines 11 and 12 being spaced apart at their ends to define an elongated gap 13 therebetween. In a typical example, the gap 13 has a width as of 0.035 inch and a length of 0.0150 inch.

The microstrip line structure 8 is conveniently formed by metalizing an input strip line conductor 14 and an output strip line conduct 15 on the top surface of a beryllia wafer 16 as of 0.015 inch or less in thickness. Input and output strip leads 10 and 20 as of 0.005 inch thick and 0.150 inch wide are bonded to the metalized conductors 14 and 15. The lower surface of the beryllia wafer 16 is also metalized over its entire surface to facilitate brazing to the base support 5 at 9. The lower metalized surface 9 of the beryllia wafer 16 forms a common ground plane conductor for both the input and output microstrip lines 11 and 12, respectively.

In a typical example, the wafer 16 has a diameter of 0.200 inch with the aforecited thickness of 0.010 inch. The input and output metalized strip line conductors 14 and 15 have a width of 0.150 inch, to yield characteristic impedances for the input and output microstrip lines of approximately 15 ohms. It is desired that such input and output microstrip line sections have a characteristic impedance of 20 ohms or less to facilitate impedance matching to high frequency transistor dies which have input and output impedances on the order of a few ohms or less.

The upper surface of the ceramic wafer 16 also has common conductor portions 17 and 18 metalized thereon and over the side edge to the lower surface 9 to facilitate grounding the transistor package 1 via grounding common leads 19 and 21 bonded to themetalized common lead portions 17 and 18, respectively. In this manner, the common leads 19 and 21 and the input and output leads 10 and 20 are all located in the same plane to facilitate fabrication of the transistor package 1. The common leads 19 and 21 are connected at their outer ends, not shown; to a suitable ground plane portion of the circuit, such as a printed circuit board in which the transistor package 1 is to be mounted. The board is indicated at 22 in FIG. 1.

The ceramic wafer 16 is slotted at 23 to provide an elongated slot passing longitudinally of the gap 13 between the input and output microstrip lines 11 and 12. The slot 23 extends through the ceramic wafer 16 for exposing the common ground plane conductor 9 at the bottom surface of the wafer 16. An electrically conductive wire 24, as of 0.015 inch in diameter, is placed within the slot 23 to extend substantially the entire length of the slot 23 and is brazed to the common conductor 9 underlaying the input and output strip line sections 11 and 12. In this manner, the wire 24, as of nickel, forms an electrically conductive strip terminal to which wire leads may be bonded, as described below.

A transistor die 25, as of 0.003 inch in thickness, 0.030 inch in width and 0.090 inch in length, is mounted overlaying the output strip conductor 15 of the strip line structure 8. The die 25 includes a collector electrode structure covering the lower major surface thereof facing the output strip conductor 15 and is bonded to the output conductor 15 in electrically conductive and in thermal exchanging relation therewith for heat sinking the die 25 to the microstrip line structure 8 and thence via the base plate 5 to the heat sink 2.

The upper major surface of the die 25 includes emitter and base pads electrode portions to which sets of conductive connector wires 26 and 27 are bonded. The wires 26 and 27 are arrayed in two sets. The first or input set of connector wires 26 interconnect the input strip line conductor 14 with a corresponding input electrode pad of the transistor die which may be either the base or the emitter electrode pad depending upon whether a common base or a common emitter transistor is desired. The second or common set of connector wires 27 is bonded between the common terminal strip 24 and the appropriate electrode pad, either the emitter or base pad, respectively. In a common base configuration, the base electrode pads on the die 25 are connected to the common terminal strip 24, whereas in a common emitter configuration the emitter electrode pads arebonded to the common strip terminal 24.

The common lead structure includes a second terminal strip portion 24' similar to terminal strip 24 disposed on the other side of the transistor die 25 from the first strip 24. The second terminal strip 24' comprises a second wire 24' brazed to the common underlying conductor 9 and disposed in a second slot 23' through the ceramic substrate wafer 16. Slot 23' is disposed in registration with a slot 28 in the output lead 15. An array of common connecting wires 27 includes an extension 27' which interconnects the second common terminal strip portion 24' and the respective set of common electrodes whether they be base or emitter electrodes depending upon whether a common base or common emitter configuration is desired.

The input set of connector wires 26 are substantially parallel to the common connector wires 27 and interdigitated therewith, such that the two sets of leads 26 and 27 are arrayed in an alternating sequence to reduce the self inductance of the common leads. The common lead inductance is reduced by virtue of the following relationship:

$$L'_c = L_c + M_{io} - M_{ic} - M_{oc}$$

where, $L'_c$ is the effective common lead inductance, $L_c$ is the common lead leakage inductance, $M_{io}$ is the mutual inductance input to common, and $M_{oc}$ is the mutual inductance output to common.

Figure 3:
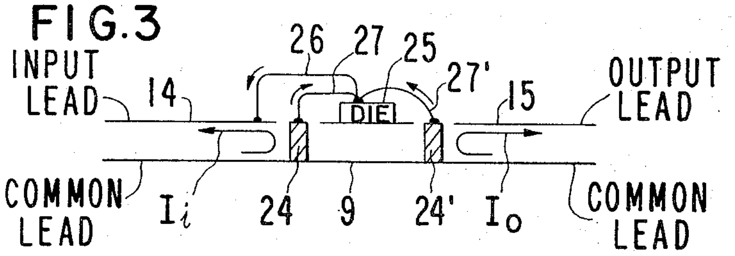
FIG. 3 is a schematic electrical circuit diagram for the electrical circuit of the structure of FIGS. 1 and 2.

The second portion 27' of the common connector wire array serves to provide an electrically parallel connection of the common connector wires with the first portion 27 of the array (see FIG. 3), whereby the common lead leakage inductance $L_c$ is substantially reduced due to paralleling of inductances to provide increased power gain and/or electrical stability (less likely to break into uncontrolled oscillation) for the resultant packaged transistor.

By closely spacing and interdigitating the input connector wires and common connector wires 26 and 27, respectively, a relatively high value of $M_{ic}$ is obtained. By closely spacing the output lead 15 to the common lead 29 and 9 the value of $M_{oc}$ is relatively high. Moreover, the input leads and common leads 26 and 27 are relatively short being only approximately 0.045 inch long. Thus these high values for $M_{ic}$ and $M_{oc}$ cancel $L_c$ and $M_{io}$ to yield a low value for $L'_c$ and thus a substantially increased value of power gain for the transistor.

A cup-shaped ceramic cap 29, as of alumina or beryllia ceramic, is hermetically sealed over the die in the inverted position to provide an hermetically sealed transistor package 1. The cap 29 is sealed, as by epoxy impregnated glass, between the lip of the cap 29 and the upper surface of the metalized wafer 16.

An advantage of the transistor package 1 of the present invention is that the common strip terminal 24, extending across the inner ends of the input and output microstrip lines 11 and 12, reduces the coupling between the input and output circuit. Fabrication of the transistor package 1 is facilitated by use of the planar strip line structure 8 and the strip terminal 24 which permits mounting of the transistor die 25 and bonding of the wires 26 and 27 in substantially a common plane and in the same direction. Moreover, this design allows the package 1 to accommodate dies 25 have widely varying sizes. In addition, hermetic sealing of the transistor package 1 is facilitated since the cap 29 is sealed substantially to a planar upper surface of the strip line structure 8.

Figure 4:
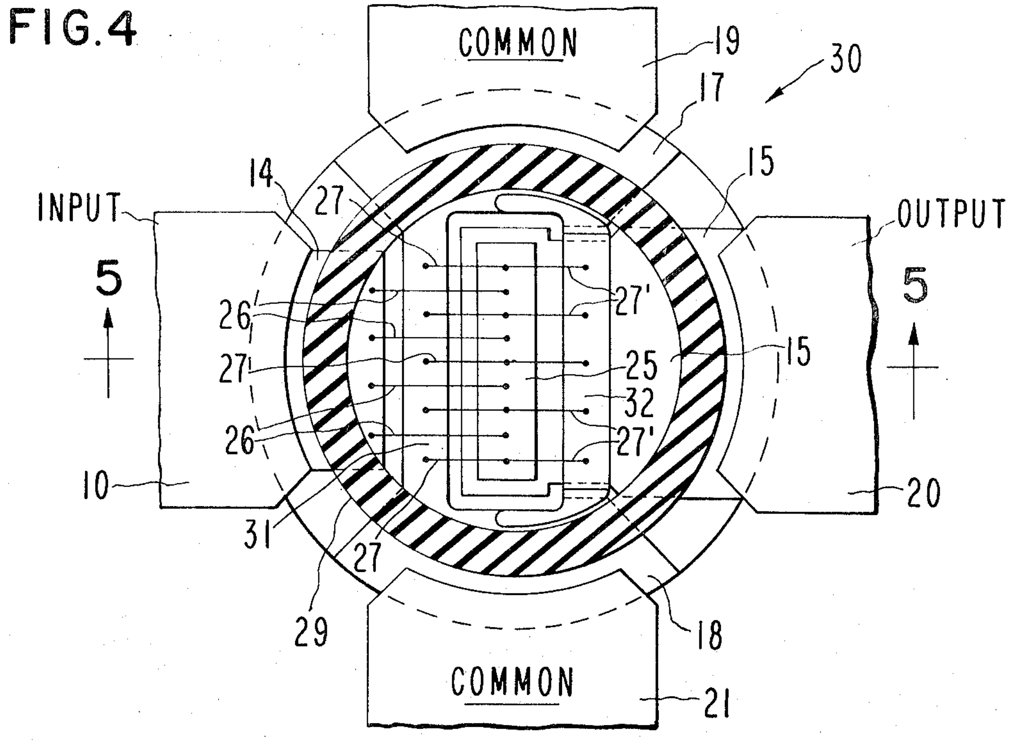
FIG. 4 is a view similar to that of FIG. 2 depicting an alternative transistor package embodiment of the present invention.
Figure 5:
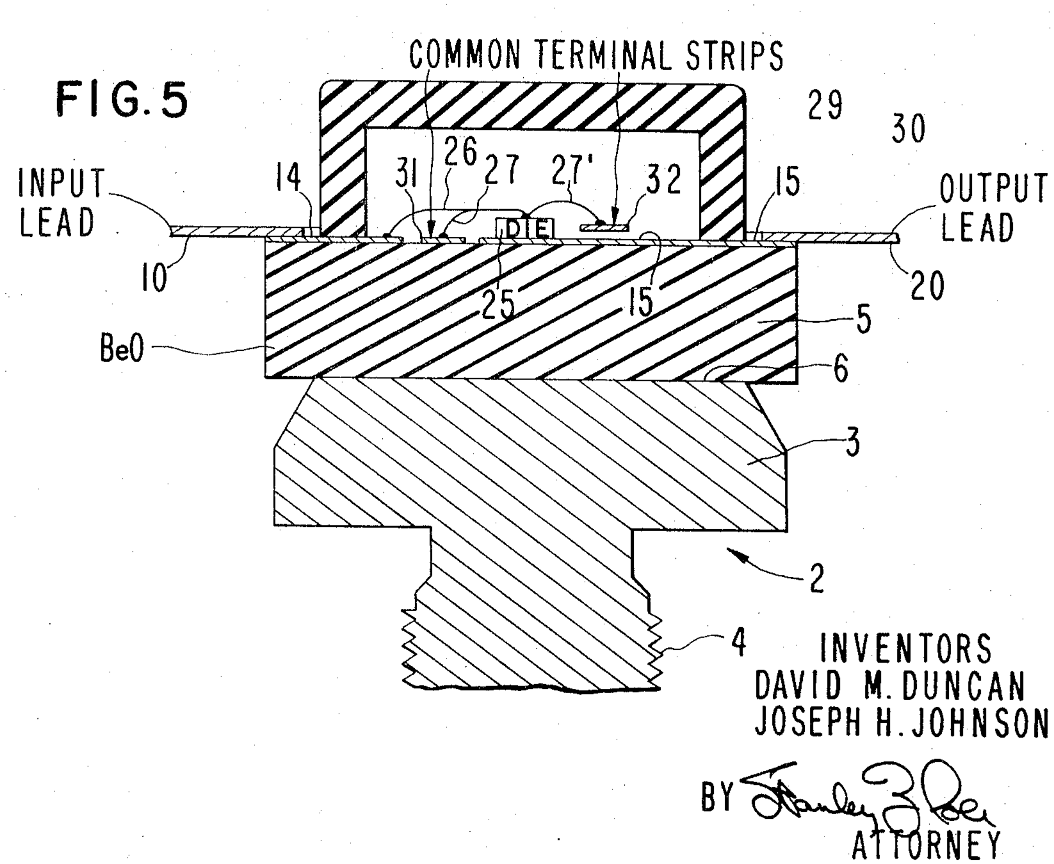
FIG. 5 is a sectional view of the structure of FIG. 4 taken along line 5—5 in the direction of the arrows.

Referring now to FIGS. 4 and 5, there is shown a lower frequency radio frequency transistor package 30 incorporating alternative features of the present invention. The transistor package 30 of FIGS. 4 and 5 is substantially the same as that previously described with regard to FIGS. 1 and 2 with the exception that the input, output and common leads, 14, 15 and (17–18), respectively, are formed directly on the upper surface of the beryllia insulator slab 5 which is brazed to stud 2 at 6 and which is not coated over its entirety with a conductive layer, as was the case in the transistor package 1 of FIGS. 1 and 2.

The common lead conductive sheet portions 17 and 18 which are formed upon the upper face of the insulative slab 5 are interconnected via a pair of common terminal strip members 31 and 32. Terminal strip portion 31 is formed directly on the upper face of the insulative slab 5 in between the mutually opposed inner ends of input lead 14 and output lead 15, whereas the second common terminal strip member 32 comprises a conductive strip, as of nickel, bridging across and over the output lead 15 and being connected at opposite ends to the common lead portions 17 and 18, respectively. Common terminal bridge strip 32 is spaced from the output lead 15 to provide an insulative gap therebetween.

The second portion 27' of the common connector wire array interconnects the common terminal bridge strip 32 and the respective set of base or emitter electrode structures on the transistor die 25, depending upon whether a common base or common emitter transistor configuration is desired. The other common terminal strip 31 is connected to the same set of electrodes on the transistor die 25 via the intermediary of the first array of common connector wires 27.

Disposing the pair of common terminal strips 31 and 32 on opposite sides of the die 25 and connecting these strips to the respective set of electrodes on the die via arrays of connector wires coming out on both sides of the die 25 reduces the common lead inductance of the resultant transistor package for the same reasons as previously advanced with regard to the transistor package of FIGS. 1 and 2.

In a typical example of a transistor embodiment as disclosed in FIGS. 1 and 2, a transistor Model E5-28, commercially available from Communication Transistor Corporation of San Carlos, Calif., provides five watts of rf power output for 1 watt of rf power input at 2 GHz with 28 volts dc supplied across the transitor. Such a transistor connected for common base has substantially improved radio frequency stability.

In another example at lower frequencies, a transistor package embodiment as disclosed in FIGS. 4 and 5, and commercially available from Communication Transistor Corporation as Model B70-12, delivered 70 watts output at 175 MHz and 12 volts supply voltage. This transistor was provided with a pair of common terminal strips 31 and 32 which resulted in an improvement in gain of 1 ½ dB, as contrasted with a prior design employing only a single common terminal strip, namely bridge strip 32.

Although the invention of the present invention has been described as it is employed in a typical transistor package, the term "transistor package" as used herein is to be defined to include integrated circuits and hybrid circuits wherein a transistor die is connected into other circuitry.

What is claimed is:

1. In a radio frequency transistor package, a transistor die having base, emitter and collector electrode structures thereon for making connection to respective underlying semiconductive regions of said transistor die, input, output and common conductive lead means for making electrical connection to said transistor die, said common lead means including a pair of terminal strip portions disposed on opposite sides of said transistor die means, an array of generally parallel input connector wires interconnecting said input lead and one of said emitter and base electrode structures, an array of generally parallel common connector wires interconnecting both of said terminal strip portions of said common lead means and the other one of said emitter and base electrode structures, an electrically insulative ceramic substrate structure, said input lead means including a conductive sheet disposed upon and interfacing with a first face of said ceramic substrate structure, said output lead means including a conductive sheet disposed upon and interfacing with said same first face of said same ceramic substrate structure, said transistor die being disposed overlaying a portion of said output lead with said collector electrode structure thereof disposed facing said output lead in mutually opposed relation therewith, said common lead means including a portion underlying said ceramic substrate structure, and wherein said array of common connector wires is connected to said underlying common lead means through openings in said ceramic substrate structure on opposite sides of said transistor die.

2. The apparatus of claim 1 wherein a substantial portion of said array of common connector wires are generally parallel to and interdigitated with said array of input connector wires.

3. The apparatus of claim 1 wherein said pair of terminal strip portions of said common lead project from said underlying common lead into respective openings in said ceramic substrate structure on opposite sides of said die to facilitate connection of said common connector wires to said terminal strip portions of said common lead.

4. The apparatus of claim 1 wherein said openings in said ceramic substrate structure are slots, a first one of said slots in said ceramic substrate being disposed between mutually opposed inner ends of said conductive sheet portions of said input and output leads, said conductive sheet portion of said output lead having a slot therein, and the second one of said slots in said ceramic substrate being disposed in registration with and underlying said slot in said output lead.

5. In a radio frequency transistor package, a transistor die having base, emitter and collector electrode structures thereon for making connection to respective underlying semiconductive regions of said transistor die, input, output and common conductive lead means for making electrical connection to said transistor die, said common lead means including a pair of terminal strip portions disposed on opposite sides of said transistor die means, an array of generally parallel input connector wires interconnecting said input lead and one of said emitter and base electrode structures, an array of generally parallel common connector wires interconnecting both of said terminal strip portions of said common lead means and the other one of said emitter and base electrode structure, an electrically insulative ceramic substrate structure, said input lead means including a conductive sheet disposed upon and interfacing with a first face of said ceramic substrate structure, said output lead means including a conductive sheet disposed upon and interfacing with said same first face of said ceramic substrate structure, said transistor die being disposed overlaying a portion of said output lead with said collector electrode structure thereof disposed facing said output lead in mutually opposed relation therewith, a first one of said pair of terminal strip portions of said common lead comprising a conductive strip disposed upon and interfacing with said first face of said ceramic substrate which is common to said input lead and output lead, said first terminal strip portion of said common lead being disposed between mutually opposed inner ends of said input and output leads, and wherein a second one of said pair of terminal strip portions of said common lead comprises a conductive bridge passing over said output lead in electrically insulative relation therewith.

6. The apparatus of claim 5 wherein a substantial portion of said array of common connector wires are generally parallel to and interdigitated with said array of input connector wires.

* * * * *